(12) United States Patent
Takimoto et al.

(10) Patent No.: US 10,483,139 B2
(45) Date of Patent: Nov. 19, 2019

(54) SUBSTRATE PROCESSING APPARATUS, METHOD OF OPERATING THE SAME AND NON-TRANSITORY STORAGE MEDIUM

(71) Applicant: TOKYO ELECTRON LIMITED, Tokyo (JP)

(72) Inventors: Yuuji Takimoto, Koshi (JP); Takashi Kai, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 416 days.

(21) Appl. No.: 14/598,750

(22) Filed: Jan. 16, 2015

(65) Prior Publication Data

US 2015/0206772 A1    Jul. 23, 2015

(30) Foreign Application Priority Data

Jan. 20, 2014   (JP) .................................. 2014-008124

(51) Int. Cl.
*H01L 21/76* (2006.01)
*H01L 21/67* (2006.01)

(52) U.S. Cl.
CPC ............................. *H01L 21/67276* (2013.01)

(58) Field of Classification Search
CPC ................................................ H01L 21/67276
See application file for complete search history.

(56) References Cited

FOREIGN PATENT DOCUMENTS

| JP | 11-016983 | * | 1/1999 |
| JP | 11-016983 | A1 | 1/1999 |

* cited by examiner

*Primary Examiner* — Levon J Shahinian
*Assistant Examiner* — Jason P Riggleman
(74) *Attorney, Agent, or Firm* — Burr & Brown, PLLC (57) ABSTRACT

The substrate processing apparatus includes a plurality of processing units each capable of performing plural kinds of processes to a substrate under plural kinds of processing conditions, and a substrate transfer mechanism that transfers a substrate to each processing unit. In one embodiment, as an operation mode of each processing unit, a monitoring mode correlated with a processing liquid to be used can be set. When at least one of the processing units is set in the monitoring mode, the substrate transfer mechanism is not uniformly prohibited to load a product substrate to the processing unit set in the monitoring mode, but is allowed to load a product wafer to be subjected to a process correlated with a processing condition, which is different from the processing condition correlated with the monitoring mode, into any one of the at least one processing unit set in the monitoring mode.

6 Claims, 5 Drawing Sheets

SUBSTRATE PROCESSING APPARATUS, METHOD OF OPERATING THE SAME AND NON-TRANSITORY STORAGE MEDIUM

CROSS-REFERENCE TO RELATED APPLICATIONS

This application is based upon and claims the benefit of priority from Japanese patent application No. 2014-008124 filed on Jan. 20, 2014, the entire contents of which are incorporated herein by reference.

FIELD OF THE INVENTION

The present invention relates to a technique for operating a substrate processing apparatus including a plurality of processing units, each of the processing units being capable of processing a substrate, such as a semiconductor wafer, with the use of a processing liquid selected from prepared processing liquids of plural kinds.

BACKGROUND ART

There is a substrate processing apparatus, which includes a placing section on which a plurality of substrate containers called cassettes, carriers or FOUPs can be placed, and which includes a plurality of processing units of a single-wafer processing type that perform parallel processing of the substrates removed from the substrate containers placed on the placing section. Transfer of the substrates from the substrate containers to the processing units is carried out by a transfer system including one or more transfer mechanisms.

In such a substrate processing apparatus including the plurality of processing units, the substrate transfer schedule during normal operation is set such that the substrates are sequentially transferred to a vacant processing unit (no substrate is loaded therein).

In the substrate processing apparatus of the aforementioned type, various situations may arise. For example, one or more processing units malfunction. In this case, the transfer schedule is changed such that lowering of throughput of the substrate processing apparatus can be restrained as much as possible. For example, Japanese patent laid-open publication JPH11-016983A describes a substrate processing apparatus including a plurality of processing units that perform the same process to substrates in parallel. If any one of the processing units malfunctions, the substrates which were scheduled to be transferred to the malfunctioning processing unit are transferred to the other functioning processing units and are processed therein.

In a substrate processing apparatus including a plurality of processing units that perform the same process to substrates in parallel during normal operation, sequential processing of product substrates is sometimes interrupted for processing of a monitor substrate. The monitor substrate is a substrate to be subjected to a new processing condition on a trial basis, for example. In this case, one or more processing units, which is selected from the plurality of processing units that process the product substrates during the normal operation, is assigned to the processing of the monitor substrate. Namely, the operation mode of the selected processing unit is set in a monitoring mode. The operation mode of the non-selected processing units is maintained in a normal mode for processing of product substrates. Then, the monitor substrates are exclusively loaded into the processing units set in the monitoring mode, into which unit the loading of the product substrates are prohibited. The processing of the product substrates are performed only in the processing units maintained in the normal mode. However, in such an operation, the throughput of the substrate processing apparatus for the product substrates is lowered.

SUMMARY OF THE INVENTION

The object of the present invention is to improve the throughput of a substrate processing apparatus for product substrates, even when a processing unit is set in a monitoring mode.

In one embodiment of the present invention, there is provided a substrate processing apparatus which includes: a plurality of processing units each capable of performing plural kinds of processes to a substrate under plural kinds of processing conditions; a substrate transfer mechanism that transfers substrates to the plurality of processing units; a control device that controls the substrate transfer mechanism; and a monitoring mode setting unit that sets and resets, as an operation mode of each of the processing units, a monitoring mode correlated with a processing condition to be used in the monitoring mode; wherein: the control device is configured to cause the substrate transfer mechanism to transfer the substrates based on the operation mode set by the monitoring mode setting unit, and when at least one of the plurality of processing units is set in the monitoring mode, the control device allows the substrate transfer mechanism to load a product substrate to be subjected to a process correlated with a processing condition, which is different from the processing condition correlated with the monitoring mode, into any one of the at least one processing unit set in the monitoring mode.

In another embodiment, there is provided a method of operating a substrate processing apparatus that includes: a plurality of processing units capable of performing plural kinds of processes to a substrate under plural kinds of processing conditions; a substrate transfer mechanism that transfers a substrate to the plurality of processing units; and a control device that controls the substrate transfer mechanism. The method includes: causing, by the control device, the substrate transfer mechanism to transfer substrates based on the operation mode set by the monitoring mode setting unit, and allowing, by the control device, when at least one of the plurality of processing units is set in the monitoring mode, the substrate transfer mechanism to load a product substrate to be subjected to a process correlated with a processing condition, which is different from the processing condition correlated with the monitoring mode, into any one of the at least one processing unit set in the monitoring mode.

In yet another embodiment, there is provided a non-transitory storage medium storing a program that is executable by a computer in a substrate processing apparatus including a plurality of processing units capable of performing plural kinds of processes to a substrate under plural kinds of processing conditions, a substrate transfer mechanism that transfers a substrate to the plurality of processing units, and a control device formed of the computer that controls the substrate transfer mechanism, wherein upon execution of the program by the computer, the control device causes the substrate processing apparatus to perform the aforementioned operation method.

According to the foregoing embodiments, loading of a product substrate into a processing unit set in the monitoring mode is not uniformly prohibited, but loading of a product substrate to be subjected to a process correlated with a processing condition, which is different from the processing condition correlated with the monitoring mode, into the processing unit set in the monitoring mode is allowed. Thus, since the processing capacity for product substrates can be correspondingly improved, the throughput of the substrate processing apparatus for product substrates can be improved.

DESCRIPTION OF EMBODIMENTS

Figure 1:
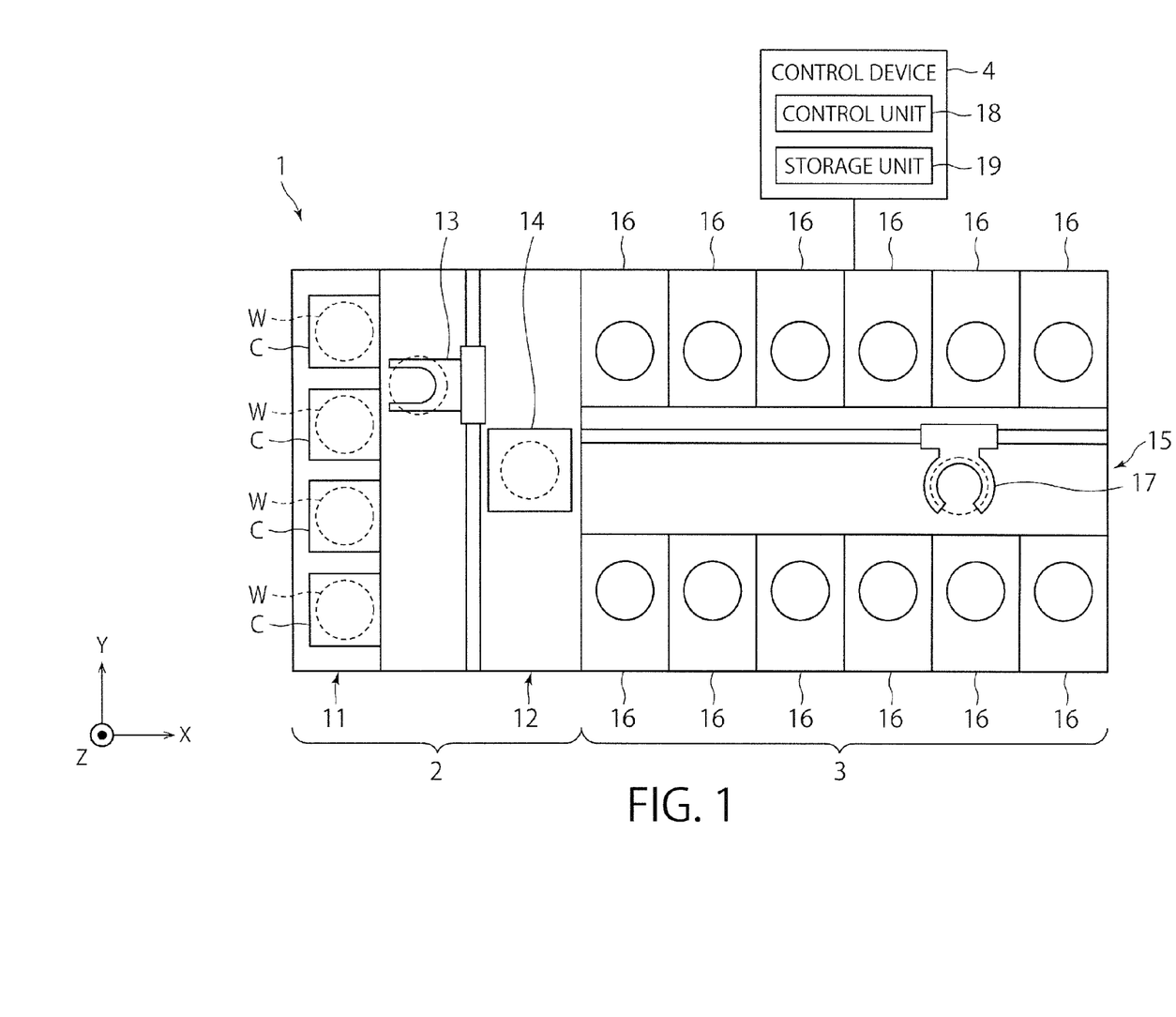
FIG. 1 is a plan view showing a schematic structure of a substrate processing system (substrate processing apparatus) in one embodiment of the present invention.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the liquid processing system 1 is provided with a control device 4. The control device 4 is, for example, a computer, and includes a control unit 18 and a storage unit 19. The storage unit 19 stores a program that controls various processings performed in the liquid processing system 1. The control unit 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Next, an outline of the processing unit is described with reference to FIG. 2.

Figure 2:
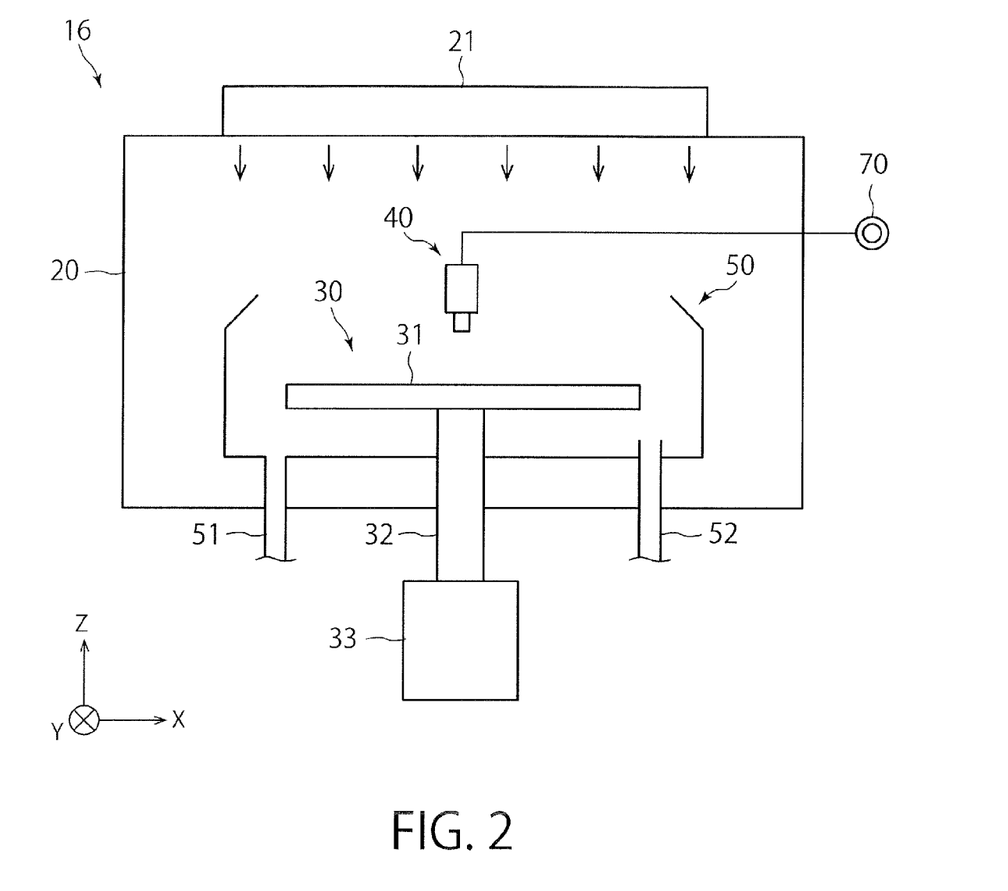
FIG. 2 is a side sectional view showing a schematic structure of a processing unit shown in FIG. 1.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

In this embodiment, each of the processing units 16 is provided with plural pairs of the processing fluid supply unit 40 and the processing fluid source 70. The respective pairs of units 40 and 70 can supply different chemical liquids, such as DHF (dilute hydrofluoric acid) of a low concentration, DHF of a ultralow concentration, SC-1 and SC-2, for example.

The above-described control device 4 controls the transfer of wafers W by the substrate transfer device 13 and the substrate transfer device 17, between the carriers C and the processing units 16.

The operation mode of each processing unit 16 can be set by the control device 4. The setting of the operation mode can be carried out through a wired or wireless communication line from a not-shown upper-level controller (e.g., a host computer) that controls control devices (to which the control device 4 of the substrate processing system 1 corresponds) of a plurality of substrate processing systems installed in a semiconductor device manufacturing factory. Alternatively, the setting of the operation mode can be carried out through a not-shown user interface (display, keyboard, touch panel and the like) provided on the substrate processing system 1. The operation mode set in each processing unit 16 is stored in the storage unit 19 of the control device 4.

The operation mode of the processing unit 16 includes a normal mode, a monitoring mode and a maintenance mode.

The normal mode is the operation mode for subjecting a product wafer PW to a predetermined process based on a specified processing recipe.

The monitoring mode is an operation mode for subjecting a monitor wafer MW (which is not a product wafer PW but is a wafer for a test run) to a predetermined process based on a specified processing recipe. The monitor wafer MW is a wafer to be subjected to a trial process based on a new processing recipe which is not yet applied to a product wafer PW, or a process for confirming compatibility of a given processing recipe with the processing unit 16 (e.g., a process for confirming whether or not the processing unit 16 can appropriately execute a processing recipe which has been successfully used in another processing unit 16 or another substrate processing system 1).

The maintenance mode is an operation mode for stopping the processing unit 16 and prohibiting a new wafer to be loaded thereinto, in order to perform a periodic or due maintenance, or to cope with some trouble. From a time point at which a certain processing unit 16 is set in the maintenance mode to a time point at which the maintenance mode is reset, the wafer transfer schedule is determined on the assumption that the processing unit in the maintenance mode 16 does not exist. The following explanation is made on the assumption that there is no processing unit 16 set in the maintenance mode, for simplifying explanation.

In the conventional technique having been used by the applicant of the present application, only the loading of a monitor wafer MW into the processing unit 16 set in the monitoring mode was allowed, while the loading of a product wafer into the processing unit 16 set in the monitoring mode was prohibited. Note that a set of the steps including loading a wafer W into a processing unit 16 and thereafter processing the wafer W in the processing may sometimes be simply referred to as "loading (a wafer W into a processing unit 16)" hereinafter for simplifying the description. That is to say, once one or more processing units 16 had been set in the monitoring mode, the processing of product wafers PW was performed only by the remaining processing units 16 that were not set in the monitoring mode. Under this operation rule, the throughput of the substrate processing system 1 for product wafers PW might be seriously lowered depending on cases.

In order to solve such a problem, in this embodiment, the monitoring mode is set so as to be correlated with a processing condition characterizing the process to a monitor wafer MW, specifically, a processing liquid (particularly main chemical liquid) to be used in the process. For example, suppose that a monitor wafer MW having been loaded into the processing unit 16 is sequentially subjected to a DHF chemical liquid cleaning process, a DIW rinsing process, an IPA (isopropyl alcohol) substitution process, and a spin-drying process in a nitrogen gas atmosphere. In this case, since the DIW rinsing process, the IPA (isopropyl alcohol) substitution process and the spin-drying process in a nitrogen gas atmosphere are processes that are generally performed after the chemical liquid cleaning process (although they may be partially modified), the processing liquid characterizing the process to the monitor wafer MW is the DHF. Thus, when a monitor wafer MW to be subjected to the above-described processes is loaded into the substrate processing system 1, the monitoring mode is set in a form of "monitoring mode (DHF)".

In this embodiment, chemical liquids of the same type, which have different concentrations, are regarded as different chemical liquids. In addition, chemical liquid of the same composition, which have different temperatures, are regarded as different chemical liquids. If DHFs of different concentrations are available, the monitoring mode can be set in a form of "monitoring mode (ultralow concentration DHF)", or "monitoring mode (low concentration DHF)". In addition, if DHFs of different temperatures are available, the monitoring mode can be set in a form of "monitoring mode (60° C. DHF)" or as "monitoring mode (80° C. DHF)". Further, the monitoring mode can be set in a form of "monitoring mode (60° C., low concentration DHF)", in consideration of both the temperature and the concentration.

In this embodiment, the loading of a product wafer into the processing unit 16 set in the monitoring mode is not uniformly prohibited. Namely, when a processing liquid, which characterizes a process to a product wafer PW and thus is correlated with the process of the product wafer PW, does not correspond to a process liquid that is correlated with the monitoring mode upon setting of the monitoring mode, the loading of the product wafer PW into the processing unit 16 is allowed. The "processing liquid, which characterizes a process to a product wafer PW and thus is correlated with the process" can be determined in the same manner as that for determining the "processing liquid, which characterizes a process to a monitor wafer MW and thus is correlated to the process".

Considering the above, when at least one of the plurality of processing units 16 is set in the monitoring mode, the control device 4 decides the transfer schedule of wafers (product wafers PW and monitor wafer(s) MW) in conformity to the following operation rules.

(1) The product wafer PW to be subjected to a process correlated with a processing liquid, which is different from a processing liquid correlated with the monitoring mode, is allowed to be loaded into any one of the processing units 16 set in the monitoring mode.

(2) The product wafer PW to be subjected to a process correlated with the processing liquid, which is the same as the processing liquid correlated with the monitoring mode, is prohibited to be loaded into any one of the processing units 16 set in the monitoring mode.

(3) The monitor wafer MW to be processed by using the processing liquid correlated with the monitoring mode is loaded into any one of the processing units 16 set in the monitoring mode.

(4) The monitor wafer MW to be processed by using the processing liquid correlated with the monitoring mode is loaded into any one of the processing units 16 set in the monitoring mode, preferentially to the product wafers PW.

The item (1) is the operation rule that is invariably observed in this embodiment. The items (2) and (3) are the optional operation rules which are preferably observed but are not necessarily observed. The item (4) is also the optional operation rule which is preferably observed but is not necessarily observed. A priority order in adoption of the optional items (2) to (4) is (2)>(3)>(4).

Based on the transfer schedule decided in conformity to the above rules, the control device causes the substrate devices 13 and 17, which constitute a substrate transfer mechanism of the substrate processing system, such that a monitor wafer MW and a product wafer PW are loaded into the processing units 16.

A concrete example of the transfer of wafers, which is performed based on the above operation rules, is described herebelow.

Figure 3:
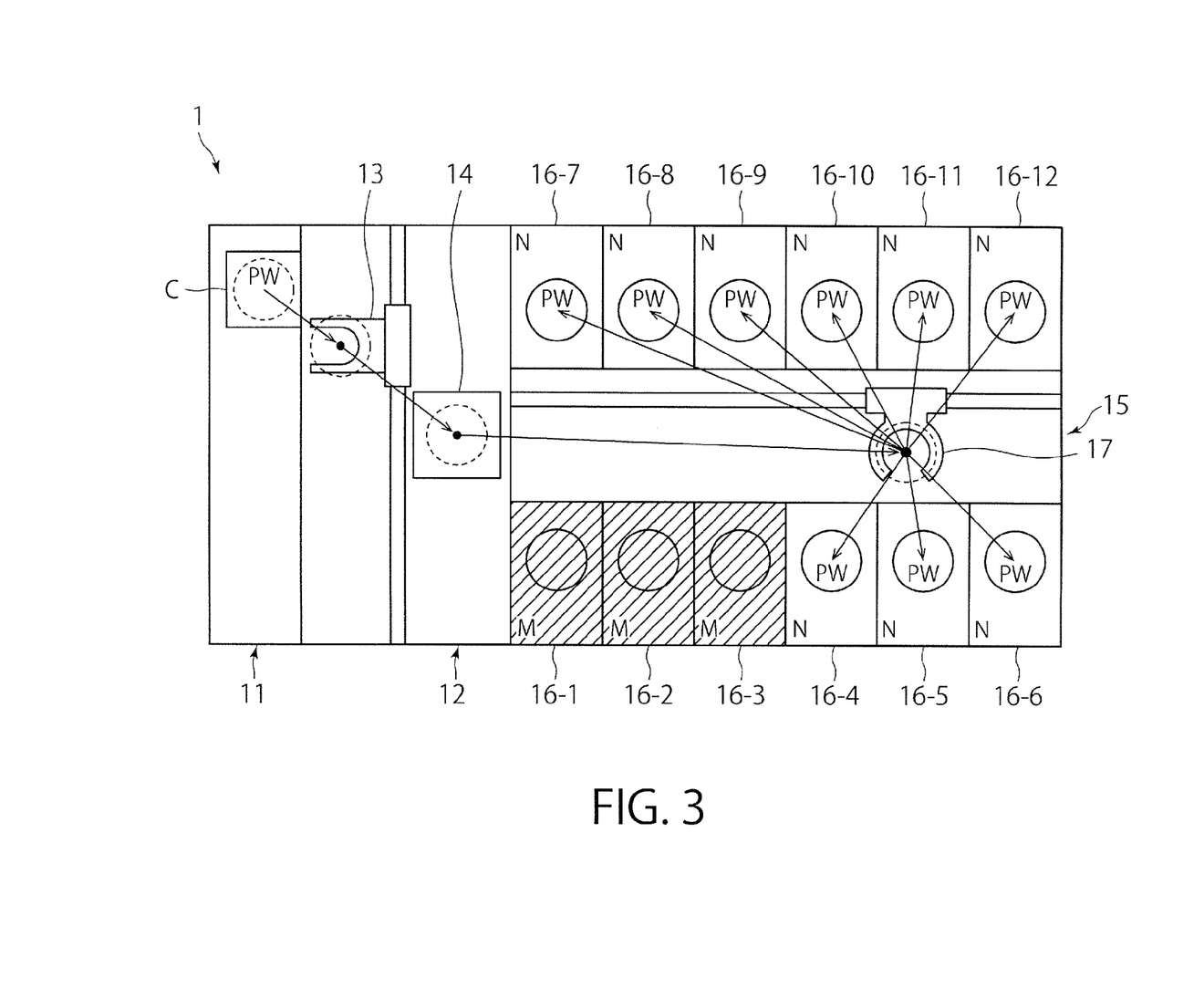
FIG. 3 is a view showing a substrate transfer procedure when some processing units are set in a monitoring mode.

For the convenience of explanation, ID numbers are given to the respective processing units 16. Specifically, as shown in FIG. 3, the ID numbers 16-1, 16-2, 16-3, 16-4, 16-5 and 16-6 are given in this order to the lower processing units 16 from the left side, and the ID numbers 16-7, 16-8, 16-9, 16-10, 16-11 and 16-12 are given in this order to the upper processing units 16 from the left side.

Firstly, the explanation is made for a case in which all the processing units 16 are set in the normal mode. In this case, product wafers PW, which have been taken out from the carrier C placed on the carrier placing section 11, are sequentially transferred to the vacant processing units 16. For example, the first twelve product wafers PW are transferred to the processing units 16-1, 16-2, 16-3, 16-4, 16-5, 16-6, 16-7, 16-8, 16-9, 16-10, 16-11 and 16-12. Unless the processing unit 16 malfunctions, since each processing unit 16 becomes vacant after completion of the process in the processing unit 16, a thirteenth product wafer PW and product wafers PW succeeding thereto are loaded into the vacant processing units 16.

Next, the explanation is made for a case in which at least one of the processing units 16 is set in the monitoring mode, and the remaining processing units 16 are set in the normal mode. Herein, the processing units 16-1, 16-2 and 16-3 (labeled "M", in FIG. 3) are set in the "monitoring mode (chemical liquid A)", while the remaining processing units 16-4, 16-5, 16-6, 16-7, 16-8, 16-9, 16-10, 16-11 and 16-12 (labeled "N", in FIG. 3) are set in the normal mode. In this example, the chemical liquid A is a DHF in which HF:DIW is 1:1000.

(Case 1)

Suppose that, after the operation mode of each processing unit 16 has been set as described above, a carrier C, containing product wafers PW to be subjected to a process correlated with the chemical liquid A, has been loaded into the carrier placing section 11. In this case, according to the aforementioned operation rules in this embodiment, the product wafer PW, which is to be subjected to the process correlated with the chemical liquid A, is prohibited to be loaded into the processing units 16 set in the "monitoring mode (chemical liquid A)".

Thus, as shown in FIG. 3, the product wafer PW, which is to be subjected to the process correlated with the chemical liquid A, is loaded into the vacant one of the processing units 16-4, 16-5, 16-6, 16-7, 16-8, 16-9, 16-10, 16-11 and 16-12, and is subjected to the process correlated with the chemical liquid A in the processing unit 16 into which the product wafer PW has been loaded.

(Case 2)

Suppose that, after the operation mode of each processing unit 16 has been set as described above, a carrier C, containing product wafers PW to be subjected to a process correlated with a chemical liquid B that is different from the chemical liquid A, has been loaded into the carrier placing section 11. In this case, according to the aforementioned operation rules in this embodiment, the product wafer PW, which is to be subjected to the process correlated with the chemical liquid B, is allowed to be loaded into the processing units 16-1, 16-2 and 16-3 set in the "monitoring mode (chemical liquid A)".

Figure 4:
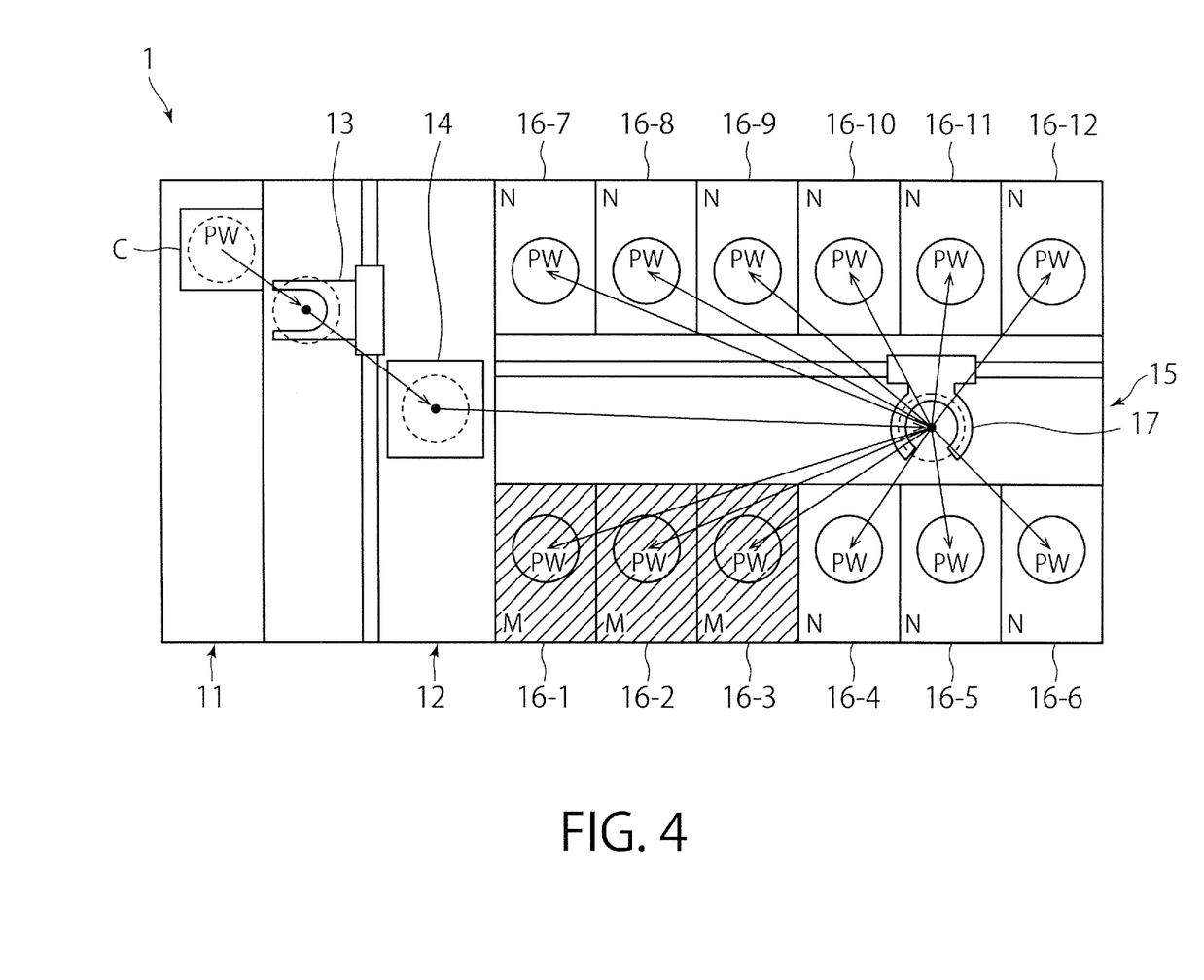
FIG. 4 is a view showing the substrate transfer procedure when some processing units are set in the monitoring mode.

Thus, as show in FIG. 4, the process wafer PW, which is to be subjected to the process correlated with the chemical liquid B, is loaded into the vacant one of the processing units 16-1, 16-2, 16-3, 16-4, 16-5, 16-6, 16-7, 16-8, 16-9, 16-10, 16-11 and 16-12, and is subjected to the process correlated with the chemical liquid B in the processing unit 16 into which the product wafer PW has been loaded.

(Case 3)

Suppose that, after the operation mode of each processing unit 16 has been set as described above, a carrier C1, containing product wafers PW to be subjected to a process correlated with a chemical liquid B that is different from the chemical liquid A, has been loaded into the carrier placing section 11, and another carrier C2, containing monitor wafers MW to be subjected to a process correlated with the chemical liquid A, has been loaded into the carrier placing section 1.

In this case, according to the aforementioned loading criteria in this embodiment, the product wafer PW to be subjected to the process correlated with the chemical liquid B is allowed to be loaded into the processing units 16-1, 16-2 and 16-3 set in the "monitoring mode (chemical liquid A)". Also in this case, the product wafer PW to be subjected to the process correlated with the chemical liquid B is also allowed to be loaded into the processing units 16-4, 16-5, 16-6, 16-7, 16-8, 16-9, 16-10, 16-11 and 16-12 set in the normal mode.

Also in this case, the monitor wafer MW to be subjected to the process correlated with the chemical liquid A is allowed to be loaded into the processing units 16-1, 16-2, and 16-3 set in the "monitoring mode (chemical liquid A)".

As described above, the product wafer PW to be subjected to the process correlated with the chemical liquid B is allowed to be loaded into the processing units 16-1, 16-2 and 16-3 set in the "monitoring mode (chemical liquid A)". However, in conformity to the aforementioned operation rule (4), the monitor wafer MW to be subjected to the process correlated with the chemical liquid A is preferentially loaded into the processing units 16-1, 16-2 and 16-3 set in the "monitoring mode (chemical liquid A)". Thus, as long as there exists a non-loaded (unprocessed) monitor wafer MW to be subjected to the process correlated to the chemical liquid A, the product wafer PW to be subjected to the process correlated with the chemical liquid B is not loaded into the processing unit 16 set in the "monitoring mode (chemical liquid A)".

Figure 5:
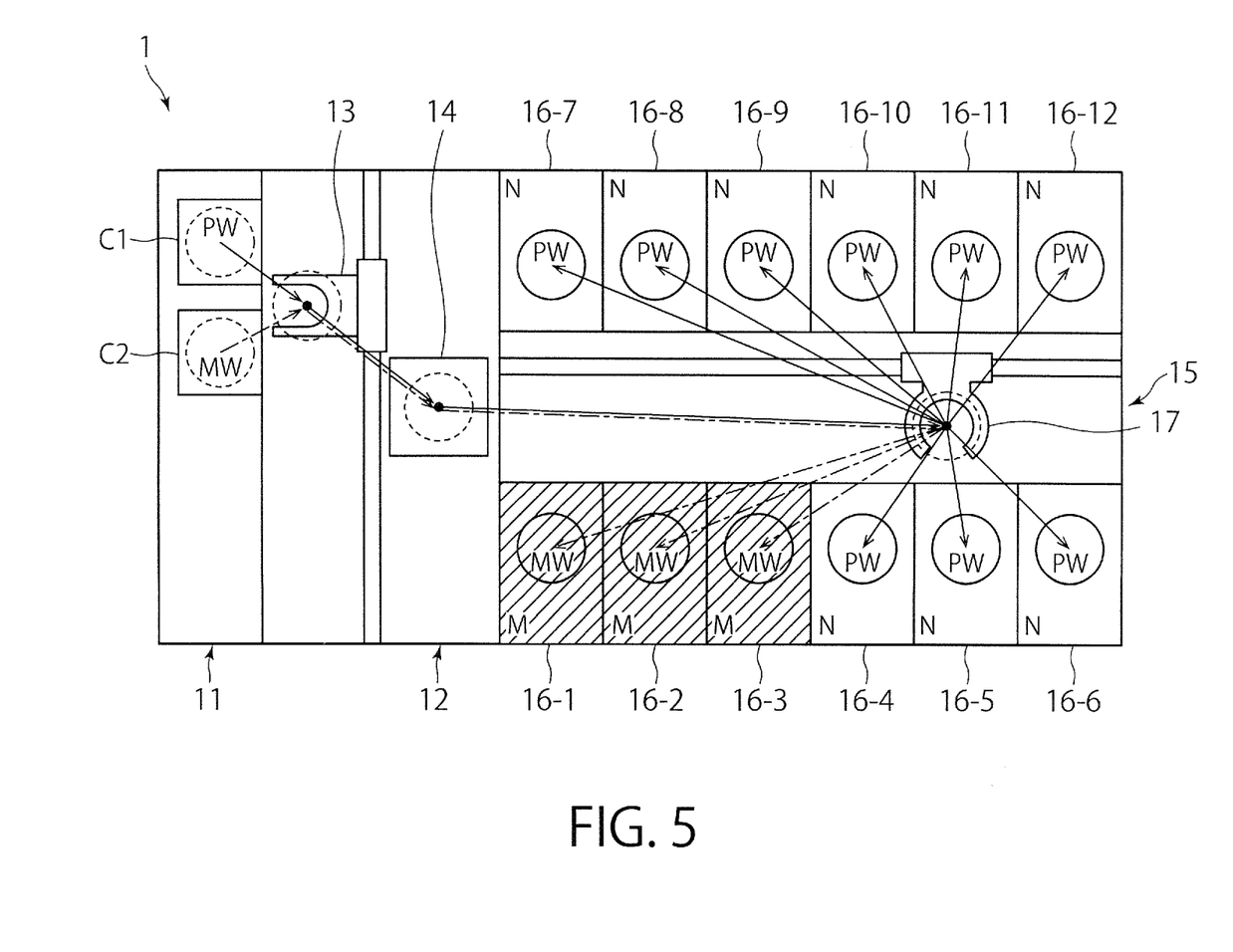
FIG. 5 is a view showing the substrate transfer procedure when some processing units are set in the monitoring mode.

Thus, as shown in FIG. 5, the product wafers PW to be subjected to the process correlated with the chemical liquid B are sequentially loaded into the vacant ones of the processing units 16-4, 16-5, 16-6, 16-7, 16-8, 16-9, 16-10, 16-11 and 16-12, and are each subjected to the process correlated with the chemical liquid B in the processing unit 16 into which the product wafer PW has been loaded. On the other hand, the monitor wafers MW to be subjected to the process correlated with the chemical liquid A are sequentially loaded into the vacant ones of the processing units 16-1, 16-2 and 16-3, and are each subjected to the process correlated with the chemical liquid A in the processing unit 16 into which the monitor wafer MW has been loaded.

Note that, in the above Case 3, if the last two monitor wafers MW in the carrier placing section 11 has been loaded into the processing units 16-1 and 16-2 of the processing units 16-1, 16-2 and 16-3 set in the "monitoring mode (chemical liquid A)", i.e., if there is the processing unit (processing unit 16-3 in this case) into which no monitor wafer MW is to be loaded any more, the product wafer PW to be subjected to the process correlated with the chemical liquid B can be loaded into that processing unit (processing unit 16-3).

(Case 4)

Suppose that, after the operation mode of each processing unit 16 has been set as described above, a carrier C1, containing product wafers PW to be subjected to a process correlated with a chemical liquid B that is different from the chemical liquid A, has been loaded into the carrier placing section 11, and another carrier C2, containing monitor wafers MW to be subjected to a process correlated with the chemical liquid A, has been loaded into the carrier placing section 11. Namely, the supposed situation in this Case 4 is the same as the above-described Case 3. However, in Case 4, a part of the operation rules is different from those applied to the above Cases 1 to 3.

In Case 4, similarly to Case 3, according to the aforementioned loading criteria in this embodiment, the product wafer PW to be subjected to the process correlated with the chemical liquid B is allowed to be loaded into the processing units 16-1, 16-2 and 16-3 set in the "monitoring mode (chemical liquid A)". In addition, the product wafer PW to be subjected to the process correlated with the chemical liquid B is also allowed to be loaded into the processing units 16-4, 16-5, 16-6, 16-7, 16-8, 16-9, 16-10, 16-11 and 16-12 set in the normal mode.

Further, similarly to Case 3, the monitor wafer MW to be subjected to the process correlated with the chemical liquid A is allowed to be loaded into the processing units 16-1, 16-2, and 16-3 set in the "monitoring mode (chemical liquid A)".

As described above, the product wafer PW to be subjected to the process correlated with the chemical liquid B is allowed to be loaded into the processing units 16-1, 16-2 and 16-3 set in the "monitoring mode (chemical liquid A)". However, if the monitor wafers MW have been processed in the processing units 16-1, 16-2 and 16-3 set in the "monitoring mode (chemical A)", the processing units 16-1, 16-2 and 16-3 set in the "monitoring mode (chemical liquid A) are excluded from the transfer destination of the product wafers PW, so that the product wafers W are not loaded into the processing units 16-1, 16-2 and 16-3. Thus, similarly to Case 3, the wafers are transferred as shown in FIG. 5.

Thus, the product wafers PW to be subjected to the process correlated with the chemical liquid B is loaded into the vacant one of the processing units 16-4, 16-5, 16-6, 16-7, 16-8, 16-9, 16-10, 16-11 and 16-12, and is subjected to the process correlated with the chemical liquid B in the processing unit 16 into which the product wafer PW has been loaded.

Note that, in the above-described Case 3, if the last two monitor wafers MW in the carrier placing section 11 are loaded into the processing units 16-1 and 16-2 of the processing units 16-1, 16-2 and 16-3 set in the "monitoring mode (chemical liquid A)", i.e., if there is the processing unit (processing unit 16-3 in this case) into which no monitor wafer MW is to be loaded any more, the product wafer PW to be subjected to the process correlated with the chemical liquid B can be loaded into that processing unit (processing unit 16-3).

An example of a switching timing between the normal mode and the monitoring mode in each processing unit 16 is described. Suppose that a command for switching from the normal mode to the monitoring mode in a certain processing unit 16 is inputted to the control device 4. In this case, if there is no wafer being processed in that processing unit 16, the switching from the normal mode to the monitoring mode is immediately performed. On the other hand, if there is a wafer being processed in that processing unit 16, the switching from the normal mode to the monitoring mode is performed after the wafer being processed has been unloaded from that processing unit 16.

When a command for switching from the monitoring mode to the normal mode (command for resetting the monitoring mode) in a certain processing unit 16 is inputted to the control device 4, the switching from the monitoring mode to the normal mode is performed after processing of all the product wafers belonging to the process lot, some of which are now being processed, has been finished and returned to the original carrier C.

The aforementioned switching timing is just one example, and the switching timing between the normal mode and the monitoring mode is not limited to the above example. If the monitoring mode is set in the plurality of processing units 16, it is preferable that the monitoring mode be set in those processing units 16 at the same time in order for the smooth operation of the substrate processing system 1, regardless of the switching timing between the normal mode and the monitoring mode. In addition, in order to enhance the degree of freedom in setting the transfer schedule, it is preferable for each processing unit 16 to be set in the monitoring mode to ensure a minimal monitoring mode setting time required for processing monitor wafers MW to be processed.

In the conventional technique in which the loading of only monitor wafers MW into the processing unit 16 set in the monitoring mode is allowed, while the loading of any product wafer PW thereinto is prohibited, when the switching to the monitoring mode and the resetting of the monitoring mode are performed on a loose schedule as described above, the following problem may occur. For example, in a case where the processing unit(s) 16 are switched to the monitoring mode at an earlier timing beyond necessity (e.g., before the carrier C containing monitor wafers MW is loaded into the carrier placing section 11, one or more processing units 16 is switched to the monitoring mode), even if there is one or more vacant processing unit 16 having been switched to the monitoring mode, no product wafer PW is loaded into the vacant processing unit(s) 16. In addition, in a case where the last monitor wafer MW, among a plurality of monitor wafers MW to be processed, is being processed in a certain processing unit 16, even when one or more of the other processing units 16 in the monitoring mode are vacant, no product wafer PW can be loaded into the vacant processing unit(s) 16. These circumstances lead to lowering of the number of product wafers PW per unit hour, i.e., lowering of a throughput.

On the other hand, in this embodiment, the loading of a product wafer PW into the processing unit 16 having been switched to the monitoring mode is not uniformly prohibited, but (a) the monitoring mode is correlated with a chemical liquid to be used, and (b) a product wafer PW, which is to be subjected to a process correlated with a chemical liquid that is different from the chemical liquid (processing liquid) correlated with the monitoring mode upon setting thereof, is allowed to be loaded into the prosing unit 16 set in the monitoring mode. Only a product wafer PW, which is subjected to a process correlated with a chemical liquid that is the same as the chemical liquid correlated with the monitoring mode upon setting thereof, is not allowed to be loaded into the processing unit 16. Therefore, inefficient halting of the processing unit 16 having sufficient time to process a product wafer PW is prevented, and thus lowering of the throughput of the substrate processing system 1 can be restrained as much as possible.

In the foregoing embodiment, the chemical liquid correlated with the monitoring mode upon setting thereof is the same (only chemical liquid A in the above example) for all the processing units 16 to be set in the monitoring mode, but is not limited thereto. For example, it is possible to set the processing unit 16-1 in the "monitoring mode (chemical liquid A)" and to set the processing unit 16-2 in a "monitoring mode (chemical liquid B)".

In addition, in the foregoing embodiment, one kind of chemical liquid is correlated with the monitoring mode upon setting thereof. However, two or more kinds of chemical liquids may be correlated with the monitoring mode (e.g., "monitoring mode (chemical liquid A/chemical liquid B)"). A product wafer PW, which is to be subjected to a process correlated with both the chemical liquid A and the chemical liquid B, may be prohibited to be loaded into the processing unit 16 set in the "monitoring mode (chemical liquid A/chemical liquid B)". Alternatively, a product wafer PW, which is to be subjected to a process correlated with at least one of the chemical liquid A and the chemical liquid B, may be prohibited to be loaded thereinto.

In addition, in the foregoing embodiment, the kind of processing liquid used in the process is used as the processing condition characterizing the process to a monitor wafer MW, but is not limited thereto. The characterizing processing condition may be: if a processing fluid for use in the process includes a liquid or a gas, a kind of the liquid or the gas, a temperature thereof, a pressure thereof, and a concentration thereof; if the processing fluid for use in the process is a mixed fluid of a liquid and a gas, a mixture ratio of the liquid and the gas; and if the process is a cleaning process, a physical cleaning member (e.g., a brush or the like) for use in the cleaning process.

In the foregoing embodiment, the substrate is a semiconductor wafer, but may a substrate of a different kind which can be used in the semiconductor manufacturing field, such as a glass substrate, a ceramic substrate and the like.

What is claimed is:

1. A substrate processing apparatus comprising:
    a plurality of processing units each processing unit being configured to accommodate one substrate of a plurality of substrates therein, the plurality of substrates including a monitor substrate and a product substrate;
    a substrate transfer mechanism that transfers substrates to the plurality of processing units; and
    a control device,
    wherein the control device controls an operation mode of each of the processing units, the operation mode including one of a normal mode or a monitoring mode, the monitoring mode being an operation mode for subjecting the monitor substrate to a first predetermined process based on a characterizing processing condition for the first predetermined process, the normal mode being an operation mode for subjecting the product substrate to a second predetermined process based on a characterizing processing condition for the second predetermined process,
    wherein the control device is configured to compare the characterizing processing condition of the second predetermined process, related to the normal mode, with the characterizing processing condition of the first predetermined process, related to the monitoring mode,
    wherein the control device is configured to judge, based on a result of the comparison, whether loading of the product substrate to be subjected to the second predetermined process in the processing unit set in the monitoring mode is allowed or prohibited,
    wherein the control device is configured to judge that the loading of the product substrate to be subjected to the second predetermined process in the processing unit set in the monitoring mode is allowed, if the characterizing processing condition of the second predetermined process is different from the characterizing processing condition of the first predetermined process, and
    wherein the control device is configured to control the substrate transfer mechanism to load the product substrate into one of a processing unit set in the normal mode or a processing unit set in the monitoring mode into which loading of the product substrate is allowed by the judgment.

2. The substrate processing apparatus according to claim 1, wherein:
    the control device is configured to control the substrate transfer mechanism to load the monitor substrate, which is to be processed in the monitoring mode, into one of the processing units set in the monitoring mode, and
    the control device is configured to prohibit the substrate transfer mechanism from loading the product substrate, which is to be subjected to a process having a characterizing processing condition, which is the same as the characterizing processing condition specified with the monitoring mode, into any one of the processing units set in the monitoring mode.

3. The substrate processing apparatus according to claim 2, wherein the control device is configured to control the substrate transfer mechanism to load the monitor substrate, which is to be processed by using the processing condition specified with the monitoring mode, into one of the processing units set in the monitoring mode, in preference to a product substrate, if any, which is to be subjected to a characterizing processing condition, which is different from the processing condition specified with the monitoring mode.

4. The substrate processing apparatus according to claim 2, wherein the control device is configured to prohibit the product substrate from being loaded into the processing units set in the monitoring mode after the monitor substrate has been processed by using the processing condition, specified with the monitoring mode, even if the product substrate is to be subjected to a characterizing processing condition, which is different from the processing condition specified with the monitoring mode.

5. The substrate processing apparatus according to claim 1, further comprising at least one of an upper-level controller configured to transmit a command to the control device, or a user interface through which a command can be inputted to the control device, the user interface being at least one of a display, a keyboard, or a touch panel.

6. The substrate processing apparatus according to claim 1, wherein each characterizing processing condition includes at least one of:

a type of a chemical liquid, a concentration of the chemical liquid, or a temperature of the chemical liquid.

* * * * *